United States Patent
Ito et al.

(10) Patent No.: US 12,469,694 B2
(45) Date of Patent: Nov. 11, 2025

(54) FILM FORMING METHOD

(71) Applicant: Tokyo Electron Limited, Tokyo (JP)

(72) Inventors: Kiwamu Ito, Yamanashi (JP); Yamato Tonegawa, Yamanashi (JP); Takeshi Oyama, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 391 days.

(21) Appl. No.: 18/194,722

(22) Filed: Apr. 3, 2023

(65) Prior Publication Data

US 2023/0335394 A1 Oct. 19, 2023

(30) Foreign Application Priority Data

Apr. 18, 2022 (JP) ................................ 2022-068325

(51) Int. Cl.
*H01L 21/02* (2006.01)
*C23C 16/34* (2006.01)
*C23C 16/36* (2006.01)

(52) U.S. Cl.
CPC ...... *H01L 21/02271* (2013.01); *C23C 16/345* (2013.01); *C23C 16/36* (2013.01); *H01L 21/02167* (2013.01); *H01L 21/0217* (2013.01)

(58) Field of Classification Search
None
See application file for complete search history.

(56) References Cited

U.S. PATENT DOCUMENTS

| | | | | |
|---|---|---|---|---|
| 2005/0255713 A1* | 11/2005 | Taguchi | ................ | C23C 16/452 118/723 R |
| 2006/0084283 A1* | 4/2006 | Paranjpe | ............. | H01L 21/3185 438/791 |
| 2006/0286775 A1* | 12/2006 | Singh | ................ | H01L 21/02126 257/E21.267 |
| 2009/0197376 A1* | 8/2009 | Kohno | .................. | C23C 16/511 257/E21.409 |
| 2021/0098254 A1* | 4/2021 | Takagi | .................... | C23C 16/24 |
| 2023/0295797 A1* | 9/2023 | Matsuki | ............. | C23C 16/4554 427/579 |

FOREIGN PATENT DOCUMENTS

| | | |
|---|---|---|
| JP | 2011-082493 | 4/2011 |
| JP | 2013-225660 | 10/2013 |
| JP | 2015-153825 | 8/2015 |
| JP | 2017-038083 | 2/2017 |
| JP | 2019-153711 | 9/2019 |

* cited by examiner

*Primary Examiner* — Asok K Sarkar
(74) *Attorney, Agent, or Firm* — IPUSA, PLLC

(57) ABSTRACT

A film forming method for forming a silicon nitride film on a substrate, includes supplying a silicon-containing gas into a processing chamber accommodating the substrate, and after the supplying the silicon-containing gas, supplying a nitrogen-containing gas into the processing chamber accommodating the substrate. An internal pressure of the processing chamber during the supplying the nitrogen-containing gas is set higher than an internal pressure of the processing chamber during the supplying the silicon-containing gas.

9 Claims, 6 Drawing Sheets

| | NH$_3$ | N$_2$ | NH$_3$ CONCENTRATION |
|---|---|---|---|
| PRESSURE INCREASING PROCESS OF REFERENCE EXAMPLE | 6000 sccm | 500 sccm | 92% |
| PRESSURE INCREASING PROCESS OF PRESENT EMBODIMENT | 6000 sccm | 6500 sccm | 48% |

FILM FORMING METHOD

CROSS-REFERENCE TO RELATED APPLICATIONS

This application is based upon and claims priority to Japanese Patent Application No. 2022-068325, filed on Apr. 18, 2022, the entire contents of which are incorporated herein by reference.

BACKGROUND

1. Field of the Invention

The present disclosure relates to film forming methods, or deposition methods.

2. Description of the Related Art

As an example, Japanese Laid-Open Patent Publication No. 2019-153711 proposes a film forming method for forming a silicon nitride film (SiN film) on a substrate. In this type of film forming method, in a case where a nitriding treatment is performed using heat, there is an advantage that nitriding of an underlayer of a substrate can be reduced compared to a case where the nitriding treatment is performed using plasma.

However, because the nitriding power of the thermal nitriding treatment is weak, a film quality of the silicon nitride film may easily deteriorate. In particular, a leak current of the silicon nitride film subjected to the thermal nitriding treatment becomes large compared to a leak current of the silicon nitride film subjected to the plasma nitriding treatment.

SUMMARY

According to one aspect of the embodiments of the present disclosure, a film forming method for forming a silicon nitride film on a substrate, includes supplying a silicon-containing gas into a processing chamber accommodating the substrate; and after the supplying the silicon-containing gas, supplying a nitrogen-containing gas into the processing chamber accommodating the substrate, wherein an internal pressure of the processing chamber during the supplying the nitrogen-containing gas is set higher than an internal pressure of the processing chamber during the supplying the silicon-containing gas.

The object and advantages of the embodiments will be realized and attained by means of the elements and combinations particularly pointed out in the claims.

It is to be understood that both the foregoing general description and the following detailed description are exemplary and explanatory and not restrictive of the invention, as claimed.

DETAILED DESCRIPTION

Figure 1A:
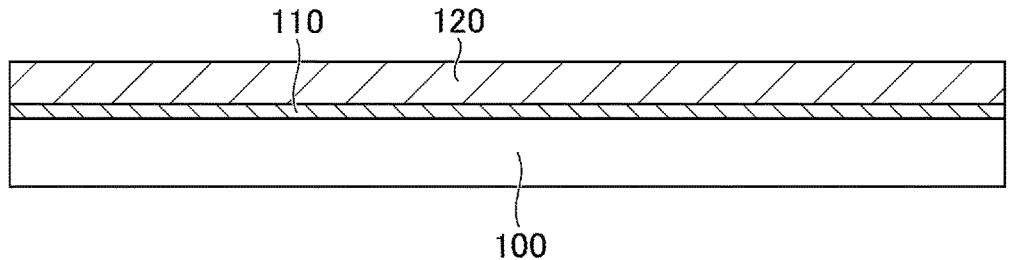
FIG. 1A is schematic cross sectional view illustrating a substrate having a silicon nitride film formed thereon by a film forming method according to one embodiment.

The present disclosure provides a technique capable of improving a film quality of a silicon nitride film that is famed.

Hereinafter, embodiments of the present disclosure will be described with reference to the drawings. In the drawings, the same constituent elements are designated by the same reference numerals, and a redundant description of the same constituent elements may be omitted.

Figure 1B:
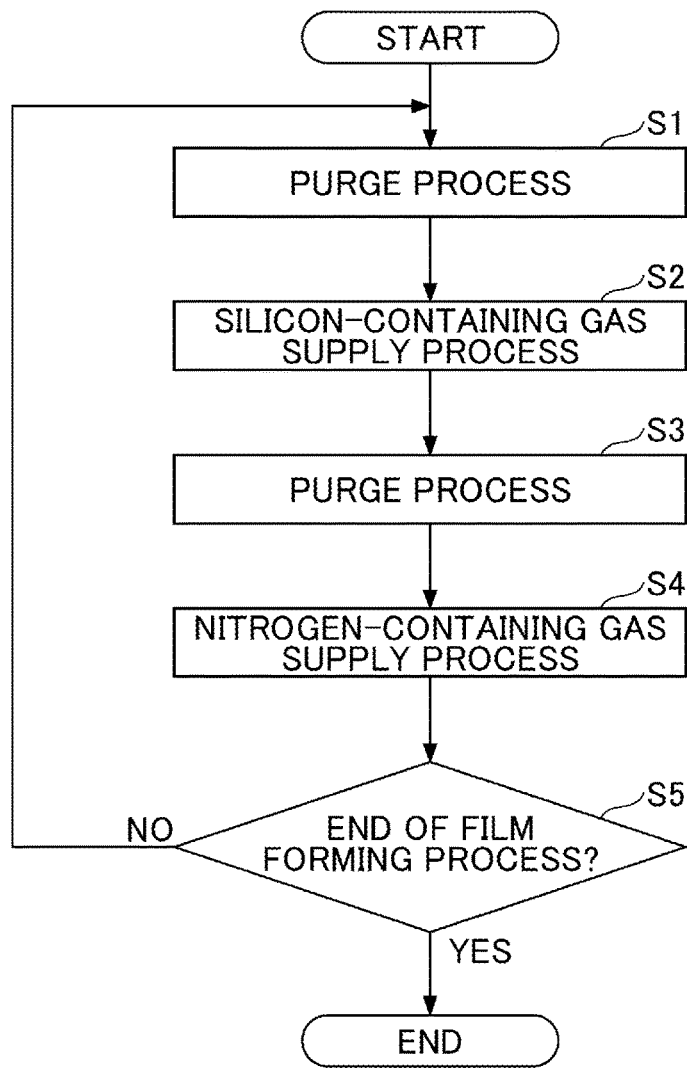
FIG. 1B is a flow chart illustrating processes of the film forming method according to one embodiment.

In a film forming method according to one embodiment of the present disclosure, a silicon nitride film 120 is formed on a surface of a substrate 100, as illustrated in FIG. 1A. For this reason, as illustrated in FIG. 1B, the film forming method includes a purge process or step S1, a silicon-containing gas supply process or step S2, a purge process or step S3, and a nitrogen-containing gas supply process or step S4. In addition, in the film forming method, the processes or steps S1 through S4 are repeated in this order until the silicon nitride film 120 reaches a desired thickness and an end of the film forming process is determined in an end determination process or step S5.

The substrate 100 on which the silicon nitride film 120 is formed may be a semiconductor wafer applied to a memory, for example. The substrate 100 is formed of polysilicon, for example. The silicon nitride film 120 may be used as an insulating film for insulating a gate of the memory. Of course, the substrate 100 on which the silicon nitride film 120 is formed may be a semiconductor wafer applied to other than the memory. For example, the silicon nitride film 120 can be used as a stop layer during etching of a substrate processing.

The silicon nitride film 120 famed by the film forming method according to the present embodiment is a SiN film. The type of the silicon nitride film 120 is not particularly limited, and may be a SiCN film, a SiBCN film, a SiON film, a SiOCN film, or the like, as will be described later.

An underlayer 110 is formed in advance on the surface of the substrate 100 where the silicon nitride film 120 is to be formed. Examples of the underlayer 110 include a silicon oxide film ($SiO_2$ film), for example. The silicon oxide film may be formed by natural oxidation of silicon. On the other hand, after the silicon nitride film 120 is formed, an amorphous silicon film (not illustrated) or the like may be famed on the silicon nitride film 120, for example.

Figure 2:
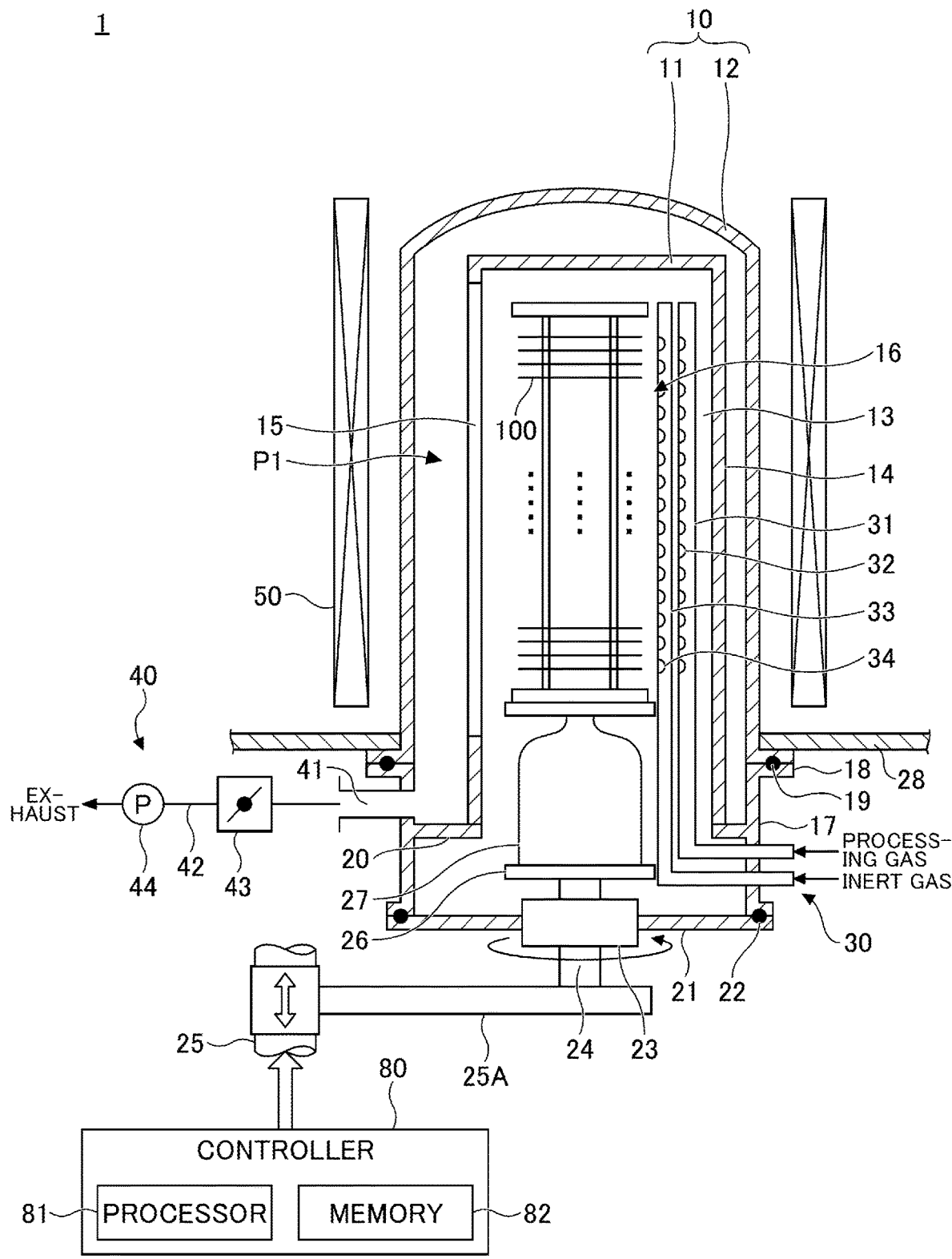
FIG. 2 is a vertical cross sectional view schematically illustrating a configuration of a film forming apparatus for performing the film forming method.

A film forming apparatus (or deposition apparatus) 1 illustrated in FIG. 2, configured to perform atomic layer deposition (ALD), may be used to perform the film forming method. Next, in order to facilitate the understanding of the present disclosure, a configuration of the film forming apparatus 1 that performs the film forming method will be described.

The film forming apparatus 1 includes a processing chamber 10 configured to accommodate a plurality of substrates 100, a gas supply unit 30 configured to supply a gas into the processing chamber 10, a gas discharge unit 40 configured to discharge the gas inside the processing chamber 10, a heater 50 configured to heat the processing chamber 10, and a controller 80 configured to control each component of the film forming apparatus 1. The film forming apparatus 1 according to the present embodiment is a thermal ALD apparatus configured to perform a film forming process by heating the substrates 100 by the heater 50, without using plasma.

The processing chamber 10 is famed to a cylindrical shape having a center axis extending in a vertical direction, in order to arrange the plurality of substrates 100 side by side along the vertical direction. For example, the processing chamber 10 includes a cylindrical inner cylinder 11 having a ceiling and an open lower end, and a cylindrical outer cylinder 12, having a ceiling and an open lower end, and covering an outer side of the inner cylinder 11. The inner cylinder 11 and the outer cylinder 12 are famed of a heat-resistant material, such as quartz or the like, and form a double structure in which the inner cylinder 11 and the outer cylinder 12 are arranged coaxially. A structure of the processing chamber is not limited to the double structure, and may have a single cylinder structure or a multiple structure including three or more cylinders.

The inner cylinder 11 has a flat ceiling, while the outer cylinder 12 has a dome-shaped ceiling. An accommodating part 13, configured to accommodate a gas nozzle 31 along the vertical direction, is formed at a predetermined circumferential position along a circumferential direction of the inner cylinder 11. As an example, the accommodating part 13 is famed on an inner side of a protruding part 14 that protrudes from a portion of a sidewall of the inner cylinder 11 toward the outer side in a radial direction.

An opening 15, that is elongated in the vertical direction, is formed in a portion of the sidewall of the inner cylinder 11 on the opposite side opposing the accommodating part 13. The opening 15 exhausts the gas inside the inner cylinder 11 to a space P1 between the inner cylinder 11 and the outer cylinder 12. A length of the opening 15 along the vertical direction may be longer than or equal to a length of a wafer boat 16 along the vertical direction.

A lower end of the processing chamber 10 is supported by a cylindrical manifold 17 formed of stainless steel, for example. A flange 18 is formed at an upper end of the manifold 17, and the flange 18 supports a flange 12f at the lower end of the outer cylinder 12. A seal member 19 is provided between the flange 12f and the flange 18, so as to hermetically seal the insides of the outer cylinder 12 and the manifold 17.

An annular support 20 protrudes radially inward from an inner wall at an upper portion of the manifold 17, and the support 20 supports the lower end of the inner cylinder 11. A lid 21 is attached to an opening at a lower end of the manifold 17 via a seal member 22, so as to provide a hermetical seal. That is, the lid 21 hermetically seals and closes the opening at the lower end of the manifold 17. The lid 21 is famed of stainless steel and is formed to a flat plate shape, for example.

A rotating shaft 24, configured to rotatably support the wafer boat 16 via a magnetic fluid seal 23, penetrates a central portion of the lid 21. The rotating shaft 24 rotates around an axial center, based on a rotational driving force from a driving source and a drive transmission mechanism (not illustrated), so as to rotate the wafer boat 16 around a vertical axis.

A lower portion of the rotating shaft 24 is supported by an arm 25A of an elevator mechanism 25 that is configured by a boat elevator or the like. The film forming apparatus 1 can move the lid 21 and the wafer boat 16 up and down integrally, by raising and lowering the arm 25A of the elevator mechanism 25, so as to insert and remove (or load and unload) the wafer boat 16 into and from the processing chamber 10.

A rotary plate 26 is provided at an upper end of the rotating shaft 24, and the wafer boat 16 that holds the substrates 100 is provided on the rotary plate 26 via a heat insulating unit 27. The wafer boat 16 is a substrate holder configured to hold the substrates 100 at predetermined intervals along the vertical direction. Each substrate 100 is supported and held in a horizontal state by the wafer boat 16, so as to extend in a horizontal direction.

The gas supply unit 30 is inserted into the processing chamber 10 via the manifold 17. The gas supply unit 30 introduces a gas, such as a processing gas, a purge gas, a cleaning gas, or the like into the inner cylinder 11. For example, the gas supply unit 30 includes the gas nozzle 31 for introducing the processing gas, and a gas nozzle 33 for introducing the purge gas.

The gas nozzles 31 and 33 are injector pipes made of quartz. The gas nozzles 31 and 33 extend along the vertical direction inside the inner cylinder 11, and are bent in an L-shape at lower ends thereof, so that the lower ends of the gas nozzles 31 and 33 penetrate manifold 17 to extend inside and outside of the manifold 17. The gas nozzle 31 includes a plurality of gas holes 32 arranged at predetermined intervals along the vertical direction, and discharges the processing gas in the horizontal direction through each of the gas holes 34. Similarly, the gas nozzle 33 includes a plurality of gas holes 34 arranged at predetermined intervals along the vertical direction, and discharges the purge gas in the horizontal direction through each of the gas holes 34. For example, the predetermined intervals at which the gas nozzles 31 and 33 are arranged along the vertical direction, are set to be the same as the predetermined intervals at which the substrates 100 are supported by the wafer boat 16. In addition, vertical positions of the gas holes 32 are set so as to be located at an intermediate position between two adjacent substrates 100 along the vertical direction, so that the gas can smoothly flow through spaces between the substrates 100.

The gas supply unit 30 supplies the processing gas to the gas nozzle 31 inside the processing chamber 10, while controlling a flow rate outside the processing chamber 10. Further, the gas supply unit 30 supplies the purge gas to the gas nozzle 33 inside the processing chamber 10, while controlling a flow rate outside the processing chamber 10. When forming the silicon nitride film 120 illustrated in FIG. 1A, a silicon-containing gas and a nitrogen-containing gas are applied as the processing gas.

The silicon-containing gas is not particularly limited. For example, a chlorine-containing silane-based compound, such as dichlorosilane (DCS: $SiH_2Cl_2$) monochlorosilane (MCS: $SiClH_3$), trichlorosilane (TCS: $SiHCl_3$), silicon tetrachloride (STC: $SiCl_4$), hexachlorodisilane (HCD: $Si_2Cl_6$), or the like may be suitably used for the silicon-containing gas. The nitrogen-containing gas may also be suitably selected depending on the silicon-containing gas. For example, an ammonia gas ($NH_3$ gas), a hydrazine ($N_2H_4$)

gas, derivatives thereof, such as a monomethylhydrazine (MMH) gas, for example, or the like, may be used for the nitrogen-containing gas. The nitrogen-containing gas in the present embodiment does not include a gas containing nitrogen molecules ($N_2$) as the sole chemical element. For example, an inert gas, such as a nitrogen ($N_2$) gas, an argon (Ar) gas, or the like, may be used for the purge gas.

The gas supply unit 30 is not limited to the configuration in which the silicon-containing gas, the nitrogen-containing gas, and the purge gas are supplied inside the processing chamber 10 by the two gas nozzles 31 and 33 as illustrated in FIG. 2. For example, the gas supply unit 30 may be configured to supply the silicon-containing gas, the nitrogen-containing gas, and the purge gas through a single common gas nozzle, or may be configured to separately supply these gases through three or more gas nozzles.

The gas discharge unit 40 discharges the gas inside the processing chamber 10 to the outside. The gas supplied by the gas supply unit 30 flows through the opening 15 of the inner cylinder 11 into the space P1 between the inner cylinder 11 and the outer cylinder 12, and is exhausted through a gas outlet 41. The gas outlet 41 is formed in the sidewall at the upper portion of the manifold 17, at a position above the support 20. An exhaust path 42 of the gas discharge unit 40 is connected to the gas outlet 41. The gas discharge unit 40 includes a pressure regulating valve 43 and a vacuum pump 44 in this order from an upstream side to a downstream side of the exhaust path 42. The gas discharge unit 40 sucks the gas inside the processing chamber 10 by the vacuum pump 44, and controls (or adjusts) a flow rate of the gas to be exhausted by the pressure regulating valve 43, so as to adjust the pressure inside (or internal pressure of) the processing chamber 10.

In addition, a temperature sensor (not illustrated), configured to detect a temperature inside (or internal temperature of) the processing chamber 10, is provided inside the processing chamber 10. A thermocouple, a resistance thermometer sensor, or the like can be used for the temperature sensor, and the temperature detected by the temperature sensor is transmitted to the controller 80.

The heater 50 is formed to a cylindrical shape covering a periphery of the processing chamber 10, and is configured to heat the substrates 100 inside the processing chamber 10 under a control of the controller 80. The heater 50 may have a temperature control function to cool the substrates 100 inside the processing chamber 10, by supplying a coolant gas between the processing chamber and the heater 50.

A computer including a processor 81, a memory 82, an input-output interface (not illustrated), or the like can be used for the controller 80. The processor 81 may be one of or a combination of a central processing unit (CPU), a graphics processing unit (GPU), an application specific integrated circuit (ASIC), a field-programmable gate array (FPGA), a circuit including a plurality of discrete semiconductors, or the like. The memory 82 may be a suitable combination of a volatile memory and a nonvolatile memory, such as a compact disc, a digital versatile disc (DVD), a hard disk, a flash memory, or the like, for example.

The memory 82 stores one or more programs for operating the film forming apparatus 1, and a recipe, such as process conditions or the like, of a substrate processing. The processor 81 controls each component of the film forming apparatus 1 by reading and executing the one or more programs of the memory 82. The controller 80 may be configured by a host computer or a plurality of client computers that communicate information via a network.

The controller 80 performs the film forming method illustrated in FIG. 1B, by controlling each component of the film forming apparatus 1 during the film forming process, so as to form the silicon nitride film 120 on the substrate 100. That is, the controller 80 performs a control to perform the purge process or step S1, the silicon-containing gas supply process or step S2, the purge process or step S3, and the nitrogen-containing gas supply process or step S4 in this order. Further, the controller 80 repeats the process or steps S1 through S4 a plurality of times, until the end of the film forming process is determined in the end determination process or step S5.

More particularly, during the purge process or step S1, the controller 80 controls the gas discharge unit to exhaust the gas inside the processing chamber 10 accommodating the plurality of substrates 100. Further, the controller 80 controls the gas supply unit 30 to supply the purge gas into the processing chamber 10 through the gas nozzle 33. As a result, the silicon-containing gas, the nitrogen-containing gas, and other reaction products remaining beforehand inside the processing chamber 10 are discharged, and replaced with the purge gas.

In this state, the controller 80 controls the pressure regulating valve 43 to regulate a discharge amount of the gas, so that the pressure inside (or internal pressure of) the processing chamber 10 becomes a target pressure of the purge process or step S1. In addition, the controller 80 controls the heater 50 while monitoring a detection temperature of the temperature sensor, to set the temperature inside (or internal temperature of) the processing chamber 10 to a target temperature of the purge process or step S1.

After the purge process or step S1 is performed for a predetermined time period, the film forming method proceeds to the silicon-containing gas supply process S2. During the silicon-containing gas supply step S2, the controller 80 controls the gas supply unit 30 to supply the silicon-containing gas into the processing chamber 10 through the gas nozzle 31. Accordingly, inside the processing chamber 10, the silicon-containing gas is adsorbed onto the surface of the substrate 100 (or underlayer 110) to form a silicon adsorption film.

In addition, the controller 80 according to the present embodiment controls the gas supply unit 30, the gas discharge unit 40, and the heater 50 so that the following process conditions are satisfied during the silicon-containing gas supply process or step S2.

Processing gas: silicon-containing gas
Internal temperature of processing chamber 10: 550° C. or higher and 630° C. or lower
Internal pressure of processing chamber 10:
3 Torr (≈400 Pa) or lower (HCD)
8 Torr (≈1.07 kPa) or lower (DCS, TCS, STC)
Flow rate of processing gas: 100 sccm or higher and 3000 sccm or lower (HCD)

After an external tank is filled with the processing gas amounting to 200 cc or more and 700 cc or less, the processing gas is introduced into the processing chamber by opening a secondary-side valve on a downstream side of the external tank (DCS, TCS, STC).

After the silicon-containing gas supply process or step S2 is performed for a predetermined time period, the film forming method proceeds to the purge process or step S3. Similar to the purge process or step S1, during the purge process or step S3, the controller 80 controls the gas supply unit 30 to supply the purge gas into the processing chamber 10, and controls the gas discharge unit to discharge the gas from the processing chamber 10.

After the purge process or step S3 is performed for a predetermined time period, the film forming method proceeds to the nitrogen-containing gas supply process or step S4. During the nitrogen-containing gas supply process or step S4, the controller 80 controls the gas supply unit 30 to supply the nitrogen-containing gas into the processing chamber 10 through the gas nozzle 31. As a result, the silicon-containing gas adsorbed on the surface of the substrate 100 reacts with the nitrogen-containing gas, to form the silicon nitride film 120. Further, as will be described later, during the nitrogen-containing gas supply process or step S4, the controller 80 supplies the inert gas ($N_2$ gas: the same type of gas as the purge gas) through the gas nozzle 33.

The controller 80 according to the present embodiment controls the gas supply unit 30, the gas discharge unit 40, and the heater 50 so that the following process conditions are satisfied during the nitrogen-containing gas supply process or step S4.

Figure 3A:
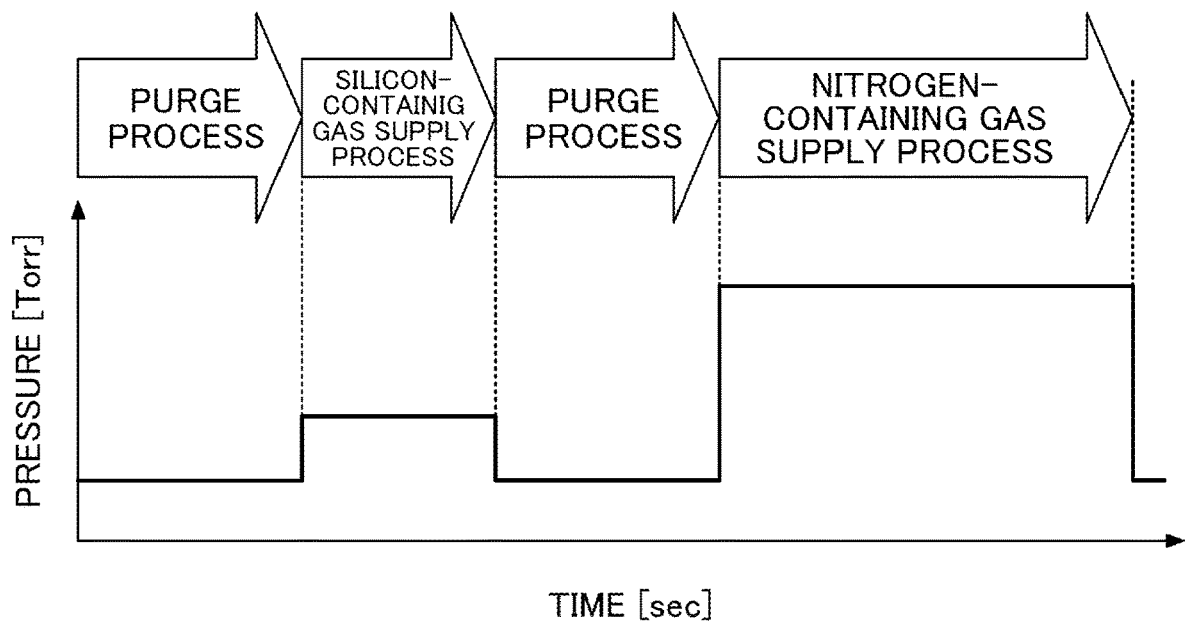
FIG. 3A is a graph illustrating an internal pressure of the processing chamber at each process of the film forming method.

Processing gas: nitrogen-containing gas
Internal temperature of processing chamber 10: 550° C. or higher and 630° C. or lower
Internal pressure of processing chamber 10:
8 Torr (≈1.07 kPa) to 100 Torr (≈13.3 kPa)
Flow rate of processing gas: 6000 sccm or higher and 13000 sccm or lower That is, as illustrated in FIG. 3A, in the film forming method according to the present embodiment, the internal pressure of the processing chamber 10 during the nitrogen-containing gas supply process or step S4 is varied so as to be higher than the internal pressure of the processing chamber 10 during the silicon-containing gas supply process or step S2. Hereinafter, the significance of increasing the internal pressure of the processing chamber 10 during the nitrogen-containing gas supply process or step S2 will be described with reference to FIG. 3B.

Figure 3B:
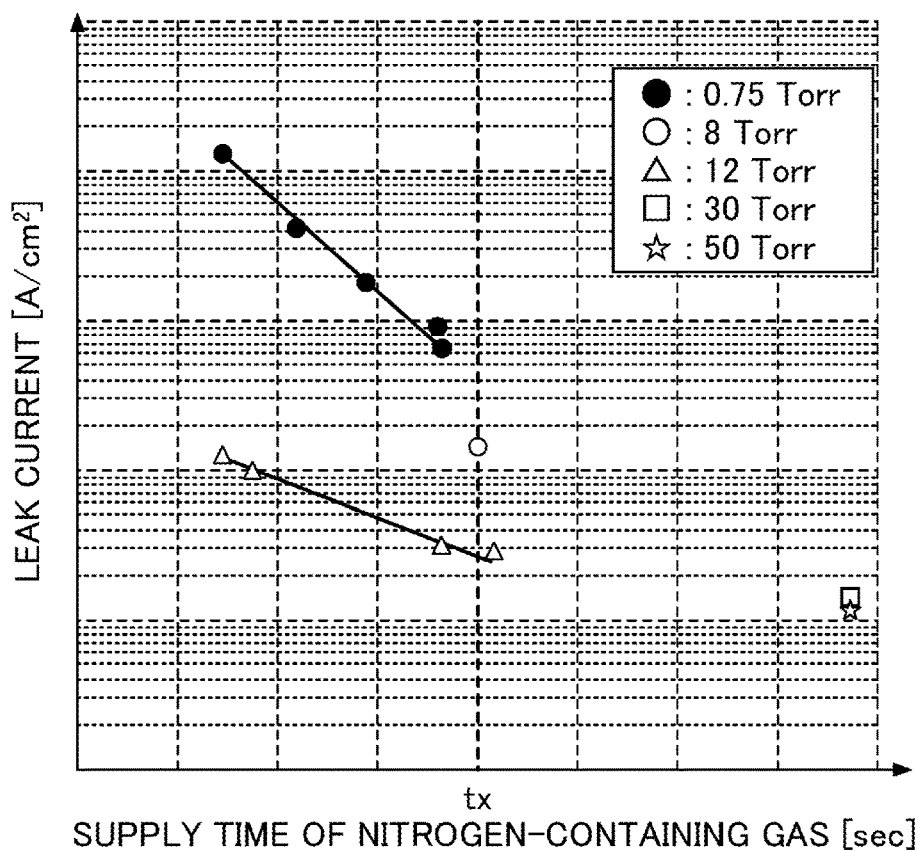
FIG. 3B is a graph illustrating a relationship between a supply time of a nitrogen-containing gas to the processing chamber and a leak current.

FIG. 3B is a graph illustrating a relationship between a supply time of the nitrogen-containing gas and a leak current of the silicon nitride film 120. In FIG. 3B, the abscissa indicates the supply time, and the ordinate indicates the leak current. The nitrogen-containing gas used in the experiment is ammonia ($NH_3$) gas. In FIG. 3B, a difference in color or tone of each point indicates a difference in the internal pressure of the processing chamber 10. Specifically, a black circle indicates 0.75 Torr, an outlined (or white) circle indicates 8 Torr, an outlined triangle indicates 12 Torr, an outlined square indicates 30 Torr, and an outlined star indicates 50 Torr.

When the leak current is large, the silicon nitride film 120, formed as the insulating film, leaks electrons, and it may be regarded that a film quality of the silicon nitride film 120 is poor. Accordingly, the film forming method is required to control the film formation (or deposition), so as to reduce the leak current.

As may be seen from FIG. 3B, in the case where the internal pressure of the processing chamber 10 is 0.75 Torr, the leak current is large even when the nitrogen-containing gas is supplied for a predetermined time period (around a point in time, tx) to form the silicon nitride film 120. On the other hand, in the case where the internal pressure of the processing chamber 10 is 8 Torr, it may be seen that the leak current is significantly reduced when the nitrogen-containing gas is supplied for the predetermined time period. In other words, in the case where the internal pressure of the processing chamber 10 is high, the leak current of the silicon nitride film 120 can be reduced even if the supply time of the nitrogen-containing gas is short.

That is, if the internal pressure of the processing chamber 10 is high at the stage where the nitrogen-containing gas is supplied, a concentration of nitrogen permeating into the silicon adsorption film adsorbed on the surface of the substrate 100 increases (that is, the silicon adsorption film becomes nitrogen-rich). For this reason, it may be regarded that the nitriding of the silicon-containing gas is further promoted (or increased) at the surface of the substrate 100, to thereby improve the film quality of the silicon nitride film 120.

In view of the above, it may be regarded that the film quality of the silicon nitride film 120 can be improved by setting the internal pressure of the nitrogen-containing gas supply process or step S4 higher than the internal pressure of the silicon-containing gas supply process or step S2. In particular, based on the graph of FIG. 3B, it may be regarded that the internal pressure of the nitrogen-containing gas supply process or step S4 is preferably higher than or equal to 8 Torr.

Further, as may also be seen from FIG. 3B, the leak current is low even in cases where the internal pressure is 30 Torr or 50 Torr and low. Accordingly, an upper limit of the internal pressure of the nitrogen-containing gas supply process or step S4 may be a withstanding pressure limit (for example, 100 Torr) of the processing chamber 10. However, as may be seen from a decreasing tendency of the leak current in the case where the internal pressure is 12 Torr, a decreasing rate of the leak current become smaller as the internal pressure becomes higher. For this reason, the internal pressure of the nitrogen-containing gas supply process or step S4 is more preferably in a range higher than or equal to 8 Torr and lower than or equal to 30 Torr. For example, as may be seen from the graph, there is no significant difference between the leak current at the internal pressure of the 50 Torr and the leak current at the internal pressure of the 30 Torr.

In addition, a ratio of the internal pressure of the nitrogen-containing gas supply process or step S4 with respect to the internal pressure of the silicon-containing gas supply process or step S2 is preferably in a range greater than or equal to 8 times and less than or equal to times. In this case, it is possible to improve an efficiency of the film forming process, while stably improving the film quality of the silicon nitride film 120 during the nitrogen-containing gas supply process or step S4. If the ratio of the internal pressures described above were less than 8 times, for example, there is a possibility that the nitriding of the silicon nitride film 120 would not progress unless the nitrogen-containing gas supply process or step S4 is performed for a long time period. On the other hand, if the ratio of the internal pressures were greater than 40 times, for example, it takes time for the internal pressure to reach the target pressure, and as a result, there is a possibility of causing a delay in film forming process.

As illustrated in FIG. 3A, in the film forming apparatus 1, the internal pressure of the processing chamber 10 slightly decreases when the purge process or step S3 is performed after the silicon-containing gas supply process or step S2. This slight decrease in the internal pressure is generated in order to sufficiently discharge the silicon-containing gas remaining inside the processing chamber 10.

Figure 4:
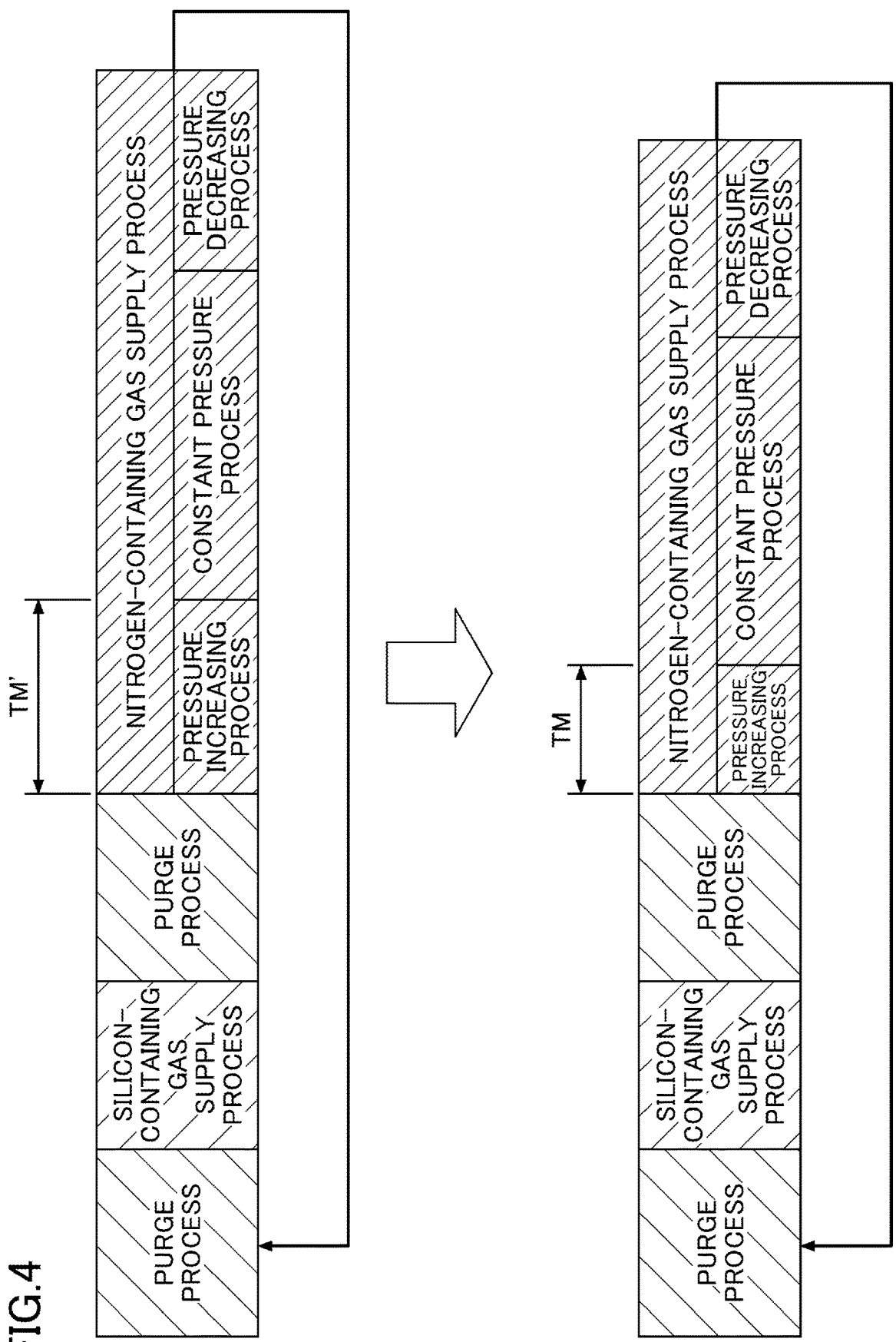
FIG. 4 is a diagram for explaining a comparison of a nitrogen-containing gas supply process according to a reference example and a nitrogen-containing gas supply process according to the present embodiment.

As illustrated in FIG. 4, during the nitrogen-containing gas supply process or step S4, the controller 80 performs a control to shorten the time required for the internal pressure to reach the target pressure of the nitrogen-containing gas supply process or step S4 from the internal pressure of the purge process or step S3.

More particularly, during the silicon-containing gas supply process or step S2, the controller 80 performs a pressure increasing process or step, a constant pressure process or step, and a pressure decreasing process or step, in order to control the internal pressure of the processing chamber 10 to the target pressure. For example, during the pressure increasing process or step (upper part of FIG. 4) according to a reference example, the nitrogen-containing gas is supplied at a flow rate that is the same as a flow rate of the silicon-containing gas during the silicon-containing gas supply process or step S2. In this case, a time period TM' of the pressure increasing process or step requires a considerably long time period until the target pressure is reached.

On the other hand, during the pressure increasing process or step (lower part of FIG. 4) according to the present embodiment, the nitrogen-containing gas is supplied at a flow rate higher than a flow rate of the silicon-containing gas during the silicon-containing gas supply process or step S2. Accordingly, a time period TM of the pressure increasing process or step is shortened, and a processing time period of the processes or steps S1 through S4 as a whole can be shortened. In particular, in the film forming process, because the processes or steps S1 through S4 are repeated a plurality of times, it is possible to significantly reduce the processing time period of the entire film forming process.

Figures 5A, 5B:
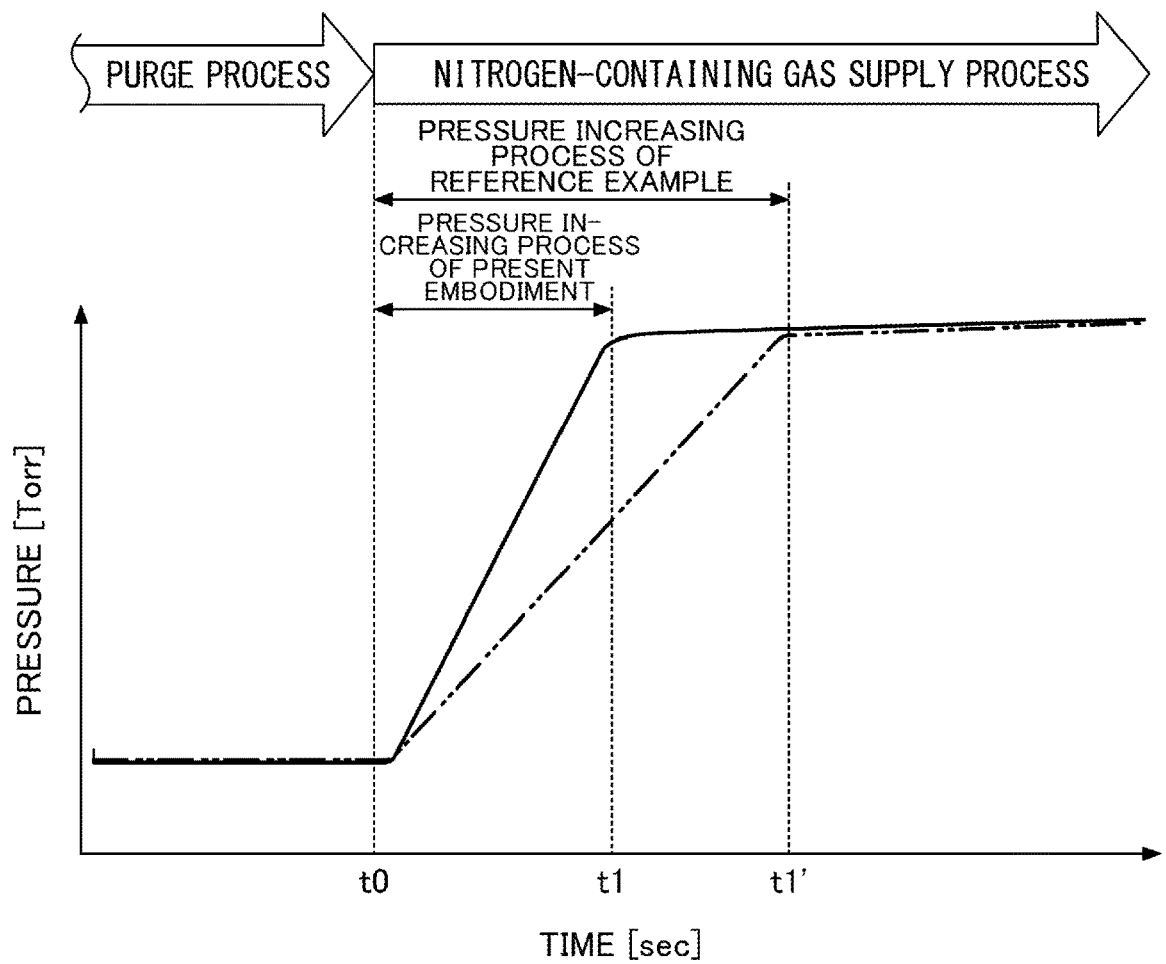
FIG. 5A is a graph illustrating flow rates of the nitrogen-containing gas and an inert gas in a pressure increasing process.
FIG. 5B is a graph illustrating a pressure change in the pressure increasing process.

More specifically, as illustrated in FIG. 5A, the controller 80 simultaneously supplies both the nitrogen-containing gas (NH$_3$ gas) and the inert gas (N$_2$ gas) during the pressure increasing process or step of the nitrogen-containing gas supply process or step S3. That is, the film forming apparatus 1 supplies the nitrogen-containing gas through the gas nozzle 31, and supplies the inert gas through the gas nozzle 33. In the pressure increasing process or step, the film forming apparatus 1 may set the flow rate of the inert gas higher than the flow rate of the purge gas (inert gas) during the purge process or step S3, while continuously supplying the inert gas from the purge process or step S3.

In particular, in the present embodiment, the controller 80 controls the flow rate of the nitrogen-containing gas and the flow rate of the inert gas to become approximately the same, and supplies the nitrogen-containing gas and the inert gas to the processing chamber 10. For example, the nitrogen-containing gas is controlled to a flow rate of 6000 sccm, and the inert gas is controlled to a flow rate of 6500 sccm.

The controller 80 is configured to supply the nitrogen-containing gas at 6000 sccm and supply the inert gas at 500 sccm during the constant pressure process or step of the nitrogen-containing gas supply process or step S4. In this case, the concentration of the nitrogen-containing gas is 92%. Accordingly, as the reference example, it is conceivable to similarly supply the nitrogen-containing gas at 6000 sccm and supply the inert gas at 500 sccm also during the pressure increasing process or step. However, if the gas supply during the pressure increasing process or step were performed at the same flow rate as the constant pressure process or step, the pressure increasing process or step would require a long time period to perform, and a start point in time, t1' of the constant pressure process or step would be delayed, as illustrated in FIG. 5B.

Hence, as described above and illustrated in FIG. 5A and FIG. 5B, the controller 80 according to the present embodiment sets the flow rate of the inert gas to 6500 sccm. For this reason, a total flow rate of the nitrogen-containing gas and the inert gas during the pressure increasing process or step becomes two or more times a total flow rate of the nitrogen-containing gas and the inert gas during the constant pressure process or step, and the internal pressure of the processing chamber 10 can quickly reach the target pressure at an early stage. As a result, the internal pressure of the processing chamber 10 increases to the target pressure in a short time period, and the start point in time, t1 of the constant pressure process or step occurs early.

Moreover, during the constant pressure process or step, the flow rate of the inert gas set at 6500 sccm during the pressure increasing process or step is switched to 500 sccm. The flow rate of the nitrogen-containing gas during the constant pressure process or step is maintained at 6000 sccm. Accordingly, during the constant pressure process or step after the internal pressure stabilizes at the target pressure, the concentration of the nitrogen-containing gas increases to 92%, and it is possible to promote the reaction between the silicon adsorption film and the nitrogen-containing gas. Even in a case where the concentration of the nitrogen-containing gas is decreased to increase the supply rate of the nitrogen-containing gas during the pressure increasing step, the film quality of the silicon nitride film 120 after the film formation does not deteriorate (that is, the leak current does not increase) by increasing the concentration of the nitrogen-containing gas during the constant pressure process or step.

Summarizing the above described control of the nitrogen-containing gas and the inert gas, the controller 80 performs the control so that the flow rate of the nitrogen-containing gas becomes less than or equal to the flow rate of the inert gas during the pressure increasing process or step, and the flow rate of the nitrogen-containing gas becomes greater than the flow rate of the inert gas during the constant pressure process or step. Accordingly, the film forming apparatus 1 can increase the internal pressure in the nitrogen-containing gas supply process or step S4, and shorten the time period of the nitrogen-containing gas supply process or step S4 (that is, the pressure increasing step). As a result, the film forming apparatus 1 can improve the efficiency of the film forming process, while improving the film quality of the silicon nitride film 120.

The film forming method according to the present disclosure is not limited to the embodiment described above, and various modifications can be made. For example, the film forming apparatus 1 is not limited to an apparatus in which the plurality of substrates 100 are arranged and processed simultaneously, and may be a single wafer type apparatus in which the substrates 100 are processed one by one. Further, the film forming apparatus 1 is not limited to a vertical processing apparatus in which the plurality of substrates 100 are arranged side by side along the vertical direction, for example, and may be a horizontal processing apparatus in which the plurality of substrates 100 are arranged side by side in the lateral direction (or horizontal direction). In other words, various types of apparatuses may be used for the film forming apparatus 1, as long as the film forming method described above can be performed.

In addition, in the pressure increasing process or step of the nitrogen-containing gas supply process or step S4, the controller 80 may control the gas discharge unit 40, to perform a gas discharge limiting operation to reduce the discharge amount of the gas (or temporarily stopping the discharge of the gas). Thus, the internal pressure of the processing chamber 10 can be increased in a short time period. The controller 80 may perform the gas discharge limiting operation while performing an operation to increase the supply amount of the inert gas during the pressure increasing process or step to become larger than the supply amount during the constant pressure process or step. Alternatively, the controller 80 may perform the gas discharge limiting operation while setting the supply amount during the pressure increasing process or step to become equal to the supply amount during the constant pressure process or step.

In the film forming method, during the pressure decreasing process or step that is performed when ending the nitrogen-containing gas supply process or step S4, a process of rapidly decreasing the internal pressure of the processing chamber 10 may be performed to shorten the processing time period. For example, during the pressure decreasing process or step, the controller 80 may decrease the internal pressure of the processing chamber 10 by stopping the supply of the gas by the gas supply unit 30, and increasing a rotational speed of the vacuum pump 44 of the gas discharge unit 40 to become higher than that during the silicon-containing gas supply process or step S2.

Figure 6:
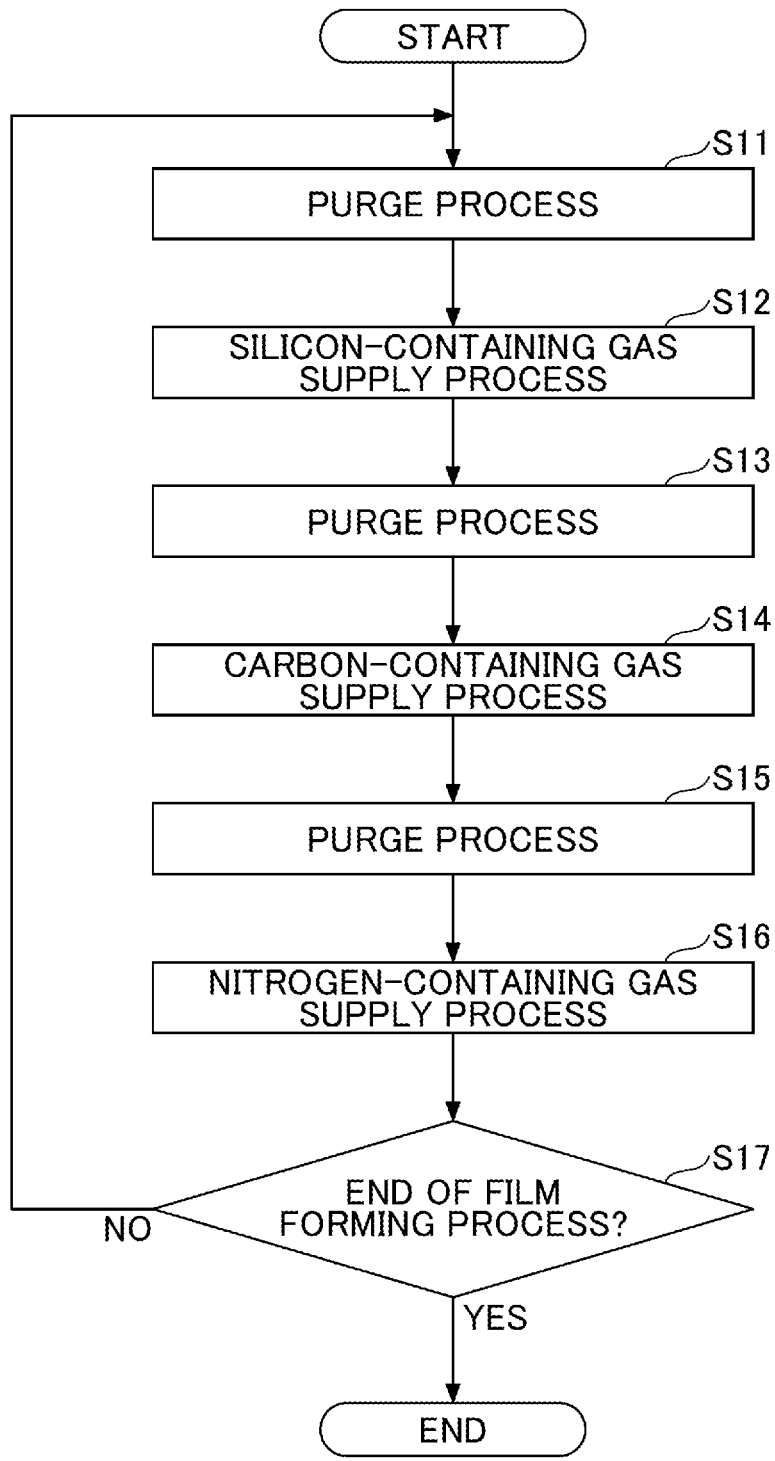
FIG. 6 is a flow chart illustrating processes of the film forming method according to a modification.

The film forming method according to the present disclosure is not limited to forming the SiN film as the silicon nitride film 120 on the substrate 100, and may form the silicon nitride film 120 including other atoms. For example, the film forming method may perform a process similar to the process described above to form a SiCN film, a SiBN film, a SiBCN film, a SiON film, a SiOCN film, or the like as the silicon nitride film 120. Hereinafter, an example of the film forming method for forming the SiCN film (nitrogen-added silicon carbide film) will be described, with reference to FIG. 6.

In the method for forming the SiCN film, a purge process or step S11, a silicon-containing gas supply process or step S12, a purge process or step S13, a carbon-containing gas supply process or step S14, a purge process or step S15, and a nitrogen-containing gas supply process or step S16 are performed in this order. Further, in the method for forming the SiCN film, the internal pressure of the processing chamber 10 during the nitrogen-containing gas supply process or step S16 is also set higher than the internal pressure of the processing chamber 10 during the silicon-containing gas supply process or step S12.

During the carbon-containing gas supply process or step S14, the film forming apparatus 1 supplies a carbon-containing gas, such as ethylene gas ($C_2H_4$ gas) or the like, into the processing chamber 10 through the gas nozzle 31 of the gas supply unit 30. In this state, the controller 80 may set the internal pressure of the processing chamber 10 lower than or equal to the internal pressure of the processing chamber 10 during the nitrogen-containing gas supply process or step S16. The silicon-containing gas supply process or step S12, the nitrogen-containing gas supply process or step S16, and the purge processes or steps S11, S13, and S15 may be performed under the same process conditions as those of the method for forming the SiN film described above. In addition, when forming the SiBN film, the SiBCN film, the SiON film, and the SiOCN film, a process or step of supplying one of or a combination of a carbon-containing gas, a boron-containing gas, and an oxygen-containing gas may be suitably introduced in place of the carbon-containing gas supply process or step S14.

In the film forming method described above, the SiCN film can be formed by nitriding the silicon carbide formed on the substrate 100 by the nitrogen-containing gas supplied during the nitrogen-containing gas supply process or step S16. In addition, in the film forming method according to the present embodiment, it is possible to create a nitrogen-rich state on the substrate 100, by increasing the internal pressure of the processing chamber during the nitrogen-containing gas supply process or step S16. As a result, it is possible to improve the film quality of the SiCN film.

Compared to the SiN film, the SiCN film is advantageous in that an etching resistance is high and a k value (or dielectric constant) is low, but a working range or application is limited due to a large leak current. On the other hand, by employing the film forming method according to the present embodiment, it is possible to improve the film quality of the SiCN film and reduce the leak current. For example, by reducing the leak current of the SiCN film to approximately the same level as the leak current of the SiN film by the film forming method, the SiCN film can be used in a wider working range or application.

The technical concept and effects of the present disclosure described in the embodiments will be described in more detail below.

According to one aspect of the present disclosure, a film forming method for forming a silicon nitride film 120 on a substrate 100, includes a silicon-containing gas supply process or step supplying a silicon-containing gas into a processing chamber 10 accommodating the substrate 100, and a nitrogen-containing gas supply process or step supplying a nitrogen-containing gas into the processing chamber 10 accommodating the substrate 100 after the silicon-containing gas supply process or step, wherein an internal pressure of the processing chamber 10 during the nitrogen-containing gas supply process or step is set higher than an internal pressure of the processing chamber 10 during the silicon-containing gas supply process or step.

According to one aspect of the present disclosure, the film forming method can improve the film quality of the silicon nitride film 120 that is formed, by setting the internal pressure of the processing chamber 10 during the nitrogen-containing gas supply process or step higher than the internal pressure of the processing chamber 10 during the silicon-containing gas supply process or step. That is, the film forming method promotes the nitriding, by setting the internal pressure of the processing chamber 10 high when supplying the nitrogen-containing gas and nitriding the silicon adsorption film. As a result, it is possible to improve the efficiency of the film forming process, and the silicon nitride film 120 that is formed can significantly reduce the leak current. Accordingly, the silicon nitride film 120 can be suitably used as an insulating film having a high insulating performance, for example.

In addition, the nitrogen-containing gas supply process or step may include a pressure increasing process or step increasing the internal pressure of the processing chamber 10 to a target pressure, and a constant pressure process or step stabilizing the internal pressure of the processing chamber 10 at the target pressure, and the pressure increasing process or step supplies an inert gas together with the nitrogen-containing gas. Accordingly, the film forming method can shorten a time required for the pressure increasing process or step to increase the internal pressure to the target pressure.

A total flow rate of the nitrogen-containing gas and the inert gas during the pressure increasing process or step may be two or more times higher than a total flow rate of the nitrogen-containing gas and the inert gas during the constant pressure process or step. In this case, the film forming method can further shorten the time required for the pressure increasing process or step to increase the internal pressure to the target pressure.

In addition, a flow rate of the nitrogen-containing gas may be lower than or equal to a flow rate of the inert gas during the pressure increasing process or step, and a flow rate of the nitrogen-containing gas may be higher than a flow rate of the inert gas during the constant pressure process or step.

Accordingly, the film forming method can shorten the time required for the pressure increasing process or step to increase the pressure to the target pressure and for the constant pressure process or step to increase the concentration of the nitrogen-containing gas. As a result, the film forming method can effectively improve the film quality of the silicon nitride film 120 while improving the processing efficiency.

Moreover, a flow rate of the gas discharged from the processing chamber 10 during the pressure increasing process or step may be set lower than a flow rate of the gas discharged from the processing chamber 10 during the constant pressure process or step, or the gas discharged from the processing chamber 10 during the pressure increasing process or step is stopped. Accordingly, the film forming method can increase the internal pressure of the processing chamber 10 in an even shorter time during the nitrogen-containing gas supply process or step.

Further, the film forming method may include a purge process or step discharging the gas inside the processing chamber 10, before the nitrogen-containing gas supply process or step, while supplying the inert gas, and the pressure increasing process or step may set a flow rate of the inert gas higher than a flow rate of the inert gas during the purge process or step. Accordingly, the film forming method can smoothly increase the flow rate of the inert gas supplied to the processing chamber 10.

In addition, an internal pressure of the processing chamber 10 during the nitrogen-containing gas supply process or step may be set in a range higher than or equal to 8 [Torr] and lower than or equal to 30 [Torr]. In this case, the film forming method can more reliably improve the film quality of the silicon nitride film 120 that is famed.

The film forming method may further include a carbon-containing gas supply process or step supplying at least one of or an arbitrary combination of a carbon-containing gas, a boron-containing gas, and an oxygen-containing gas, before the nitrogen-containing gas supply process or step. Accordingly, the film forming method can improve the film quality of the silicon nitride film 120 that is even when forming the SiCN film, the SiBN film, the SiBCN film, the SiON film, or the SiOCN film.

The film forming method according to the disclosed embodiment is illustrative in all respects and is not restrictive. The embodiments can be modified and improved in various forms without departing from the scope and spirit of the subject matter of appended claims. The matters described in the embodiments can also employ other configurations as long as there is no contradiction, and can be combined as long as there is no contradiction.

According to one aspect of the present disclosure, it is possible to provide a technique capable of improving a film quality of a silicon nitride film that is famed.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A film forming method for forming a silicon nitride film on a substrate, comprising:
    supplying a silicon-containing gas into a processing chamber accommodating the substrate; and
    supplying a nitrogen-containing gas into the processing chamber accommodating the substrate after the supplying the silicon-containing gas,
    wherein an internal pressure of the processing chamber during the supplying the nitrogen-containing gas is set higher than an internal pressure of the processing chamber during the supplying the silicon-containing gas.

2. The film forming method as claimed in claim 1, wherein an internal pressure of the processing chamber during the supplying the nitrogen-containing gas is set in a range higher than or equal to 8 [Torr] and lower than or equal to 30 [Torr].

3. The film forming method as claimed in claim 1, further comprising:
    supplying at least one of or an arbitrary combination of a carbon-containing gas, a boron-containing gas, and an oxygen-containing gas, before the supplying the nitrogen-containing gas.

4. The film forming method as claimed in claim 1, wherein
    the supplying the nitrogen-containing gas includes
        increasing the internal pressure of the processing chamber to a target pressure, and
        stabilizing the internal pressure of the processing chamber at the target pressure, and
    the increasing the internal pressure supplies an inert gas together with the nitrogen-containing gas.

5. The film forming method as claimed in claim 4, wherein a total flow rate of the nitrogen-containing gas and the inert gas during the increasing is two or more times higher than a total flow rate of the nitrogen-containing gas and the inert gas during the stabilizing.

6. The film forming method as claimed in claim 4, wherein
    a flow rate of the nitrogen-containing gas is lower than or equal to a flow rate of the inert gas during the increasing, and
    a flow rate of the nitrogen-containing gas is higher than a flow rate of the inert gas during the stabilizing.

7. The film forming method as claimed in claim 4, wherein a flow rate of the gas discharged from the processing chamber during the increasing is set lower than a flow rate of the gas discharged from the processing chamber during the stabilizing, or the gas discharged from the processing chamber during the increasing is stopped.

8. The film forming method as claimed in claim 4, further comprising:
    discharging the gas inside the processing chamber, before the supplying the nitrogen-containing gas, while supplying the inert gas,
    wherein the increasing sets a flow rate of the inert gas higher than a flow rate of the inert gas during the discharging.

9. The film forming method as claimed in claim 4, further comprising:
    supplying at least one of or an arbitrary combination of a carbon-containing gas, a boron-containing gas, and an oxygen-containing gas, before the supplying the nitrogen-containing gas.

* * * * *